United States Patent
Chen et al.

(10) Patent No.: US 6,914,823 B2
(45) Date of Patent: Jul. 5, 2005

(54) DETECTING OVER PROGRAMMED MEMORY AFTER FURTHER PROGRAMMING

(75) Inventors: Jian Chen, San Jose, CA (US); Yan Li, Milpitas, CA (US); Jeffrey W. Lutze, San Jose, CA (US)

(73) Assignee: Sandisk Corporation, Sunnyvale, CA (US)

( * ) Notice: Subject to any disclaimer, the term of this patent is extended or adjusted under 35 U.S.C. 154(b) by 167 days.

(21) Appl. No.: 10/628,962

(22) Filed: Jul. 29, 2003

(65) Prior Publication Data

US 2005/0024943 A1 Feb. 3, 2005

(51) Int. Cl.[7] .............................................. G11C 16/06
(52) U.S. Cl. ........................... 365/185.22; 365/185.02; 365/185.03; 365/185.24
(58) Field of Search .................... 365/185.02, 185.03, 365/185.22, 185.24, 185.28

(56) References Cited

U.S. PATENT DOCUMENTS

| | | |
|---|---|---|
| 5,321,699 A | 6/1994 | Endoh et al. |
| 5,386,422 A | 1/1995 | Endoh et al. |
| 5,422,580 A | 6/1995 | Mandel et al. |
| 5,469,444 A | 11/1995 | Endoh et al. |
| 5,532,962 A | 7/1996 | Auclair et al. |
| 5,602,789 A | 2/1997 | Endoh et al. |
| 5,771,346 A | 6/1998 | Norman |
| 5,867,429 A | 2/1999 | Chen et al. |
| 5,986,929 A | 11/1999 | Sugiura et al. |
| 6,112,314 A | 8/2000 | Norman |
| 6,131,140 A | 10/2000 | Rodgers et al. |
| 6,185,134 B1 | 2/2001 | Tanaka |
| 6,222,762 B1 | 4/2001 | Guterman et al. |
| 6,278,632 B1 | 8/2001 | Chevallier |
| 6,411,548 B1 | 6/2002 | Sakui et al. |
| 6,429,724 B1 | 8/2002 | Ogura et al. |
| 6,456,528 B1 | 9/2002 | Chen |
| 6,493,266 B1 | 12/2002 | Yachareni et al. |
| 6,522,580 B2 | 2/2003 | Chen et al. |
| 6,542,407 B1 | 4/2003 | Chen et al. |
| 6,799,256 B2 * | 9/2004 | Van Buskirk et al. .. 365/189.01 |
| 6,847,553 B2 * | 1/2005 | Chen et al. ............ 365/185.09 |
| 2003/0002348 A1 | 1/2003 | Chen et al. |
| 2003/0206435 A1 | 11/2003 | Takahashi |

FOREIGN PATENT DOCUMENTS

| | | |
|---|---|---|
| WO | WO 02 50843 | 6/2002 |
| WO | WO 04 001852 | 12/2003 |

* cited by examiner

*Primary Examiner*—Son Mai
(74) *Attorney, Agent, or Firm*—Vierra Magen Marcus; Harmon & DeNiro LLP

(57) ABSTRACT

In a non-volatile semiconductor memory system (or other type of memory system), a memory cell is programmed by changing the threshold voltage of that memory cell. Because of variations in the programming speeds of different memory cells in the system, the possibility exists that some memory cells will be over programmed. That is, in one example, the threshold voltage will be moved past the intended value or range of values. The present invention includes determining whether the memory cells are over programmed.

38 Claims, 12 Drawing Sheets

|  | 1 | 0 |
|---|---|---|
| Read at VopSP' | 1/0 | 0 |
| Second Data Latch | 1/0 | 0 |
| First Data Latch | 1 | 0 |
| Test | Pass/Fail | Pass |

|  | 11 | 10 | 00 | 01 |
|---|---|---|---|---|
| Read at VopSP' | 1/0 | 0 | 0 | 0 |
| Second Data Latch | 1/0 | 0 | 0 | 0 |
| Third Data Latch | 1 | 0 | 0 | 0 |
| Test | Pass/Fail | Pass | Pass | Pass |

Fig. 19

|  | 1 | 0 |
|---|---|---|
| Read at Vop10' | 1 | 1/0 |
| Second Data Latch | 1 | 1/0 |
| First Data Latch | 1 | 0 |
| Test | Pass | Pass/Fail |

Fig. 20

|  | 11 | 10 | 00 | 01 |
|---|---|---|---|---|
| Read at Vop10' | 1 | 1/0 | 0 | 0 |
| Second Data Latch | 1 | 1/0 | 0 | 0 |
| First Data Latch | 1 | 1 | 0 | 0 |
| Test | Pass | Pass/Fail | Pass | Pass |

Fig. 21

|  | 11 | 10 | 00 | 01 |
|---|---|---|---|---|
| Read at Vop00' | 1 | 1 | 1/0 | 0 |
| Second Data Latch | 1 | 1 | 1/0 | 0 |
| Third Data Latch | 1 | 0 | 0 | 1 |
| Test | Pass | Pass | Pass/Fail | Pass |

Fig. 22

|  | 11 | 10 | 00 | 01 |
|---|---|---|---|---|
| Read at Vop01' | 1 | 1 | 1 | 1/0 |
| Second Data Latch | 1 | 1 | 1 | 1/0 |
| Test | Pass | Pass | Pass | Pass/Fail |

DETECTING OVER PROGRAMMED MEMORY AFTER FURTHER PROGRAMMING

CROSS-REFERENCE TO RELATED APPLICATIONS

This Application is related to United States Patent Application titled "DETECTING OVER PROGRAMMED MEMORY," by Jian Chen, Yan Li and Jeffrey W. Lutze, filed on the same day as the present application, which is incorporated herein by reference.

BACKGROUND OF THE INVENTION

1. Field of the Invention

The present invention relates generally to technology for memory devices and, more specifically, to detecting whether memory devices have been over programmed.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Typical EEPROMs and flash memories utilize a memory cell with a floating gate that is provided above and insulated from a channel region in a semiconductor substrate. The floating gate is positioned between source and drain regions. A control gate is provided over and insulated from the floating gate. The threshold voltage of the memory is controlled by the amount of charge that is retained on the floating gate. That is, the minimum amount of voltage that must be applied to the control gate before the memory cell is turned on to permit conduction between its source and drain is controlled by the level of charge on the floating gate.

Some EEPROM and flash memory devices have a floating gate that is used to store two ranges of charges and, therefore, the memory cell can be programmed/erased between two states. When programming an EEPROM or flash memory device, a program voltage is applied to the control gate and the bit line is grounded. Electrons from the p-well are injected into the floating gate. When electrons accumulate in the floating gate, the floating gate becomes negatively charged and the threshold voltage of the memory cell is raised.

Typically, the program voltage applied to the control gate is applied as a series of pulses. The magnitude of the pulses is increased with each pulse by a predetermined step size. In the periods between the pulses, verify operations are carried out. That is the programming level of each cell being programmed in parallel is read between each programming pulse to determine whether it is equal to or greater than a verify level to which it is being programmed. One means of verifying the programming is to test conduction at a specific compare point.

Conduction represents an "on" state of the device corresponding to the flow of current across the channel of the device. An "off" state corresponds to no current flowing across the channel between the source and drain. Typically, a flash memory cell will conduct if the voltage being applied to the control gate is greater than the threshold voltage and the memory cell will not conduct if the voltage applied to the control gate is less than the threshold voltage. By setting the threshold voltage of the cell to an appropriate value, the cell can be made to either conduct or not conduct current for a given set of applied voltages. Thus, by determining whether a cell conducts current at a given set of applied voltages, the state of the cell can be determined.

A multi-bit or multi-state flash memory cell is produced by identifying multiple, distinct threshold voltage ranges within a device. Each distinct threshold voltage range corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes. Proper data storage requires that the multiple ranges of threshold voltage levels of a multi-state memory cell be separated from each other by sufficient margin so that the level of the memory cell can be programmed or erased in an unambiguous manner.

In many cases it is necessary to program multiple memory cells in parallel, for example, in order to produce a commercially desirable memory system which can be programmed within a reasonable amount of time. However, a problem arises when a number of the memory cells are to be programmed at the same time. This is because the characteristics of each memory cell is different due to minor variations in the structure and operation of the semiconductor devices which comprise the memory cells; therefore, variations in the programming speed of different cells will typically occur. This results in memory cells that become programmed faster than others and the possibility that some memory cells will be programmed to a different state than intended. Faster programming of multiple memory cells can result in over-shooting desired threshold voltage level ranges, producing errors in the data being stored.

Typically, when data is being programmed, the verify process for the device will guarantee that the threshold voltage of the memory cell is higher than a minimum level. However, devices typically do not guarantee an upper limit on the threshold voltage. Some devices do check to see if a soft programming process (described below) raised the threshold voltage too high; however, these devices do not check to see if a regular programming process raised the threshold voltage too high. Thus, over programming which raises the threshold voltage beyond the range for the desired state can occur without being noticed. Over programming can cause the memory cell to store incorrect data, thereby, causing an error during subsequent read operations. More information about over programming can be found in U.S. Pat. Nos. 5,321,699; 5,386,422; 5,469,444; 6,134,140 and 5,602,789.

To correct for over programming many memory systems use Error Correction Codes ("ECC") during subsequent read operations. When data is read from a device, the ECC is used to determine whether an error occurred. If the errors are small enough, the ECC can be used to correct the errors. However, at least three problems arise when using ECC to correct errors due to over programming. First, the ECC process requires a large amount of processing time and, therefore, considerably slows down the operation of the memory system. Second, ECC requires additional dedicated hardware to perform the ECC in a reasonable amount of time. Such dedicated hardware can take up a considerable amount of room on the memory system chips. The trend is to reduce the size of the memory systems in order to be able to put more memory cells in the system and to make the system as small as possible to fit in smaller host devices. Thus, new memory designs typically are reducing the amount of real estate that can be used for ECC. Third, if there are multiple errors, the ECC may not be able to correct the errors.

Thus, there is a need for an improved means to detect over programming of memory cells.

SUMMARY OF THE INVENTION

The present invention, roughly described, pertains to technology for detecting whether a memory device has been over programmed. Once it is detected that one or more memory devices have been over programmed, the system can remedy the situation by any one of a number of known means for correcting data. For example, the system can re-write the data to the same or a different memory device. Such over programming detection assures that the data is free from errors due to over programming so that the requirements of the ECC can be reduced.

One embodiment of the present invention includes a method for detecting over programming in a memory system that uses multiple logical pages. The method includes programming a first multi-state storage element with data for a particular logical page and using data from a different logical page to determine whether the first multi-state storage element was over programmed. In one implementation, the system determines whether a threshold voltage of the first multi-state storage element is greater than a compare value. The system concludes that the first multi-state storage element is over programmed if the threshold voltage of the first multi-state storage element is greater than the compare value and the data for the different logical page indicates that the threshold voltage of the first multi-state storage element should not be greater than the compare value. The over programming detection is performed after both logical pages have been programmed.

Another embodiment of the present invention includes programming one or more multi-state storage elements associated with a first control line and subsequently programming one or more multi-state storage elements associated with the second control line. A determination is made as to whether one or more of the multi-state storage elements associated with the first control line are over programmed after programming the one or more multi-state storage elements associated with the second control line. The control lines can be word lines, bit lines, or another type of control line (depending upon the technology). In one embodiment, the over program determination is made by performing read operations on the multi-state storage elements associated with the first control line for edges of one or more over program ranges and determining that multi-state storage elements associated with a first control line are over programmed if they have a threshold voltage within one of the over program ranges. In another embodiment, the over program determination is made by performing read operations on the multi-state storage elements associated with the first control line for a set of one or more read compare points in order to determine initial states for the multi-state storage elements associated with the first control line; performing an error correction code process the multi-state storage elements associated with the first control line and the initial state; and determining that a multi-state storage element is over programmed if the error correction code process fails for that multi-state storage element.

In yet another embodiment, the present invention includes programming a first multi-state storage element and programming a second multi-state storage element. The system determines whether the first multi-storage element is over programmed after programming the second multi-storage element.

In one embodiment, the system implementing the present invention includes an array of storage elements and a managing circuit. The managing circuit can include dedicated hardware and/or can include hardware that is programmed by software stored on one or more storage devices such as non-volatile memory (e.g. flash memory, EEPROM, etc.) or other memory devices. In one embodiment, the managing circuit includes a controller and a state machine. In another embodiment, the managing circuit only includes a state machine and not a controller. The managing circuit can perform the steps discussed above. In some embodiments, the process for verifying whether a storage element is over programmed is performed by the state machine. In some implementations, the state machine is on the same integrated circuit chip as the array of storage elements.

These and other objects and advantages of the present invention will appear more clearly from the following description in which the preferred embodiment of the invention has been set forth in conjunction with the drawings.

BRIEF DESCRIPTION OF THE DRAWINGS

FIG. 16 depicts memory threshold distributions with an alternate set of compare points for performing over program detection.

FIGS. 17–22 are truth tables for additional embodiments of performing over program detection.

DETAILED DESCRIPTION

Figure 1:
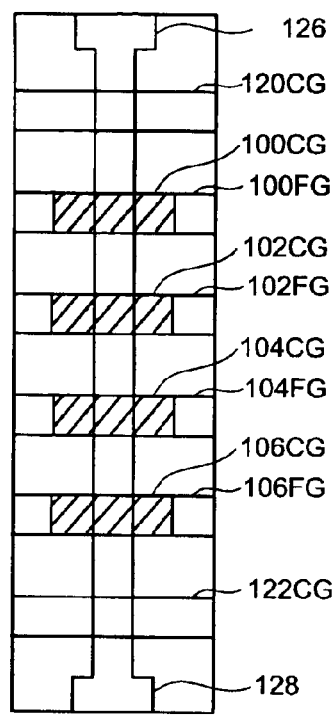
FIG. 1 is a top view of a NAND string.
Figure 2:
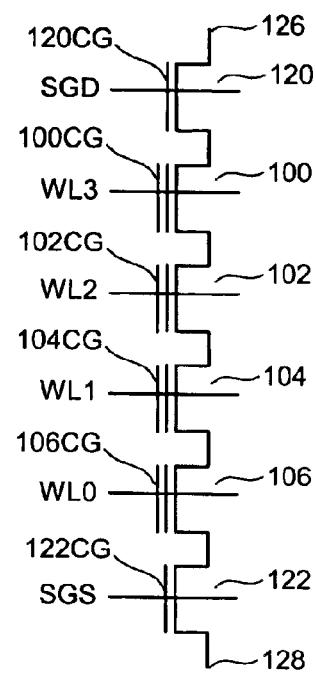
FIG. 2 is an equivalent circuit diagram of the NAND string.

One example of a flash memory system uses the NAND structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by the applying appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0.

Figure 3:
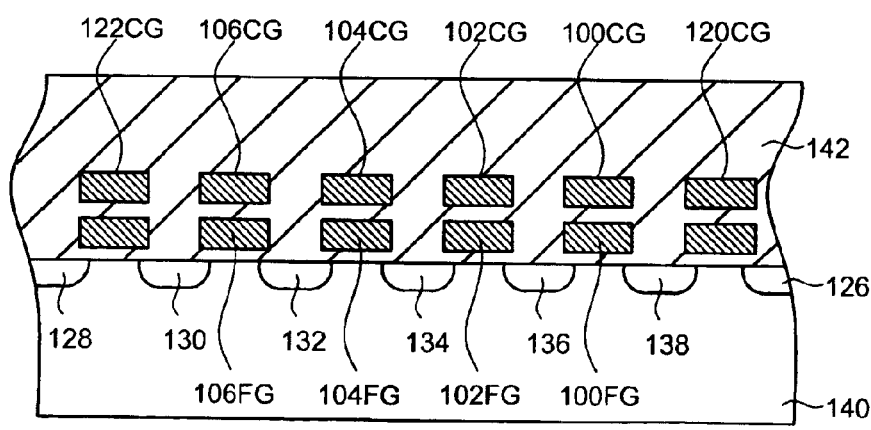
FIG. 3 is a cross sectional view of the NAND string.

FIG. 3 provides a cross-sectional view of the NAND string described above. As depicted in FIG. 3, the transistors (also called cells or memory cells) of the NAND string are formed in p-well region 140. Each transistor includes a stacked gate structure that consists of the control gate (100CG, 102CG, 104CG and 106CG) and a floating gate (100FG, 102FG, 104FG and 106FG). The floating gates are formed on the surface of the p-well on top of an oxide film. The control gate is above the floating gate, with an oxide layer separating the control gate and floating gate. Note that FIG. 3 appears to depict a control gate and floating gate for transistors 120 and 122. However, for transistors 120 and 122, the control gate and the floating gate are connected together. The control gates of the memory cells (100, 102, 104, 106) form the word lines. N+ diffused layers 130, 132, 134, 136 and 138 are shared between neighboring cells whereby the cells are connected to one another in series to form a NAND string. These N+ diffused layers form the source and drain of each of the cells. For example, N+ diffused layer 130 serves as the drain of transistor 122 and the source for transistor of 106, N+ diffused layer 132 serves as the drain for transistor 106 and the source for transistor 104, N+ diffused region 134 serves as the drain for transistor 104 and the source for transistor 102, N+ diffused region 136 serves as the drain for transistor 102 and the source for transistor 100, and N+ diffused layer 138 serves as the drain for transistor 100 and the source for transistor 120. N+ diffused layer 126 connects to the bit line for the NAND string, while N+ diffused layer 128 connects to a common source line for multiple NAND strings.

Note that although FIGS. 1–3 shows four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string.

Figure 4:
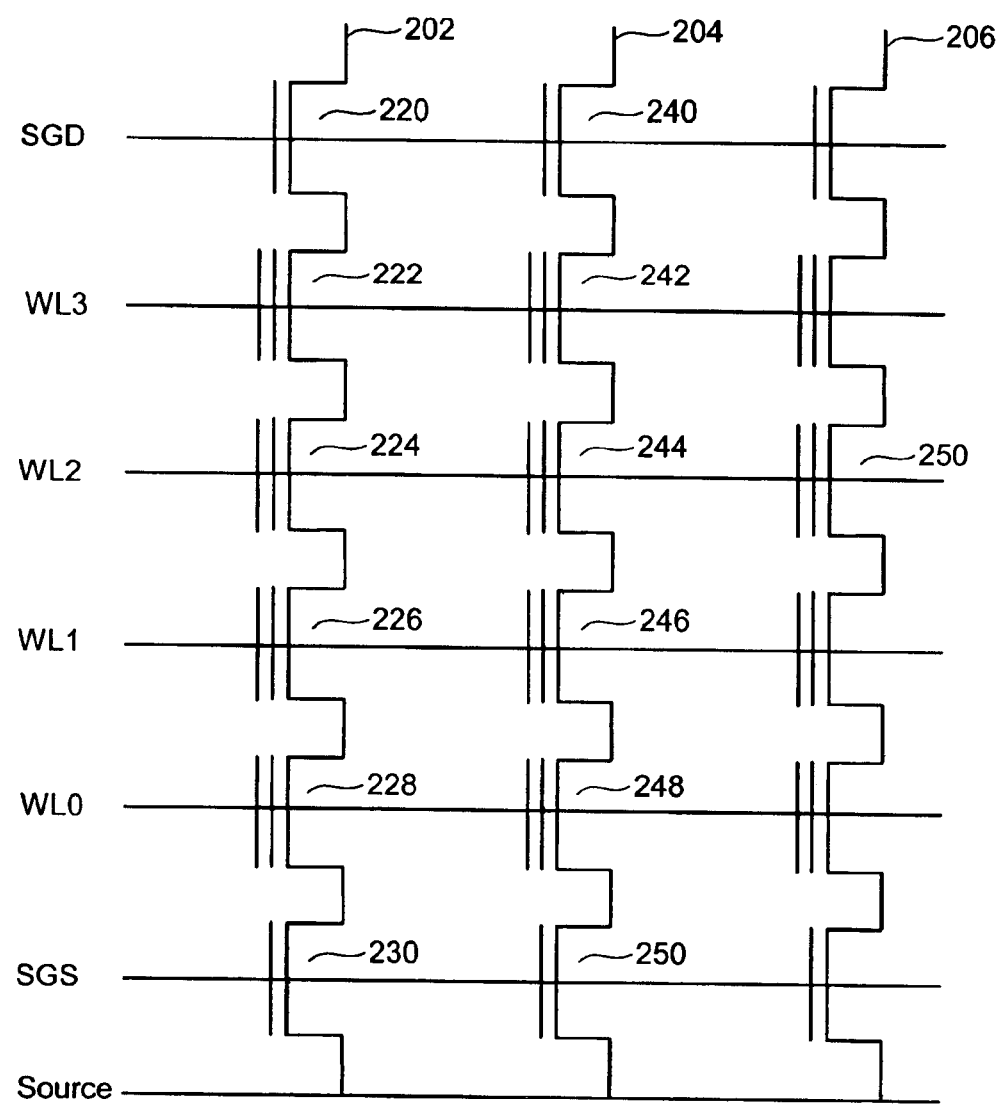
FIG. 4 is a circuit diagram depicting three NAND strings.

A typical architecture for a flash memory system using a NAND structure will include several NAND strings. For example, FIG. 4 shows three NAND strings 202, 204 and 206 of a memory array having many more NAND strings. Each of the NAND strings of FIG. 4 includes two select transistors and four memory cells. For example, NAND string 202 includes select transistors 220 and 230, and memory cells 220, 224, 226 and 228. NAND string 204 includes select transistors 240 and 250, and memory cells 242, 244, 246 and 248. Each string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224, memory cell 244, and memory cell 250. Word line WL1 is connected to the control gates for memory cell 226 and memory cell 246. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array.

Each memory cell can store data (analog or digital). When storing one bit of digital data, the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage after a program operation is positive and defined as logic "0." When the threshold voltage is negative and a read is attempted, the memory cell will turn on to indicate logic one is being stored. When the threshold voltage is positive and a read operation is attempted, the memory cell will not turn on, which indicates that logic zero is stored. A memory cell can also store multiple levels of information, for example, multiple bits of digital data. In the case of storing multiple levels of data, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00."

Relevant examples of NAND type flash memories and their operation are provided in the following U.S. Patents/Patent Applications, all of which are incorporated herein by reference in their entirety: U.S. Pat. No. 5,570,315; U.S. Pat. No. 5,774,397, U.S. Pat. No. 6,046,935, U.S. Pat. No. 6,456,528 and U.S. patent application. Ser. No. 09/893,277 (Publication No. US2003/0002348). Other types of flash memory devices can also be used with the present invention. For example, the following patents describe NOR type flash memories and are incorporated herein by reference in their entirety: U.S. Pat. Nos. 5,095,344; 5,172,338; 5,890,192 and 6,151,248. Another example of a flash memory type is found in U.S. Pat. No. 6,151,248, incorporated herein by reference in its entirety.

Figure 5:
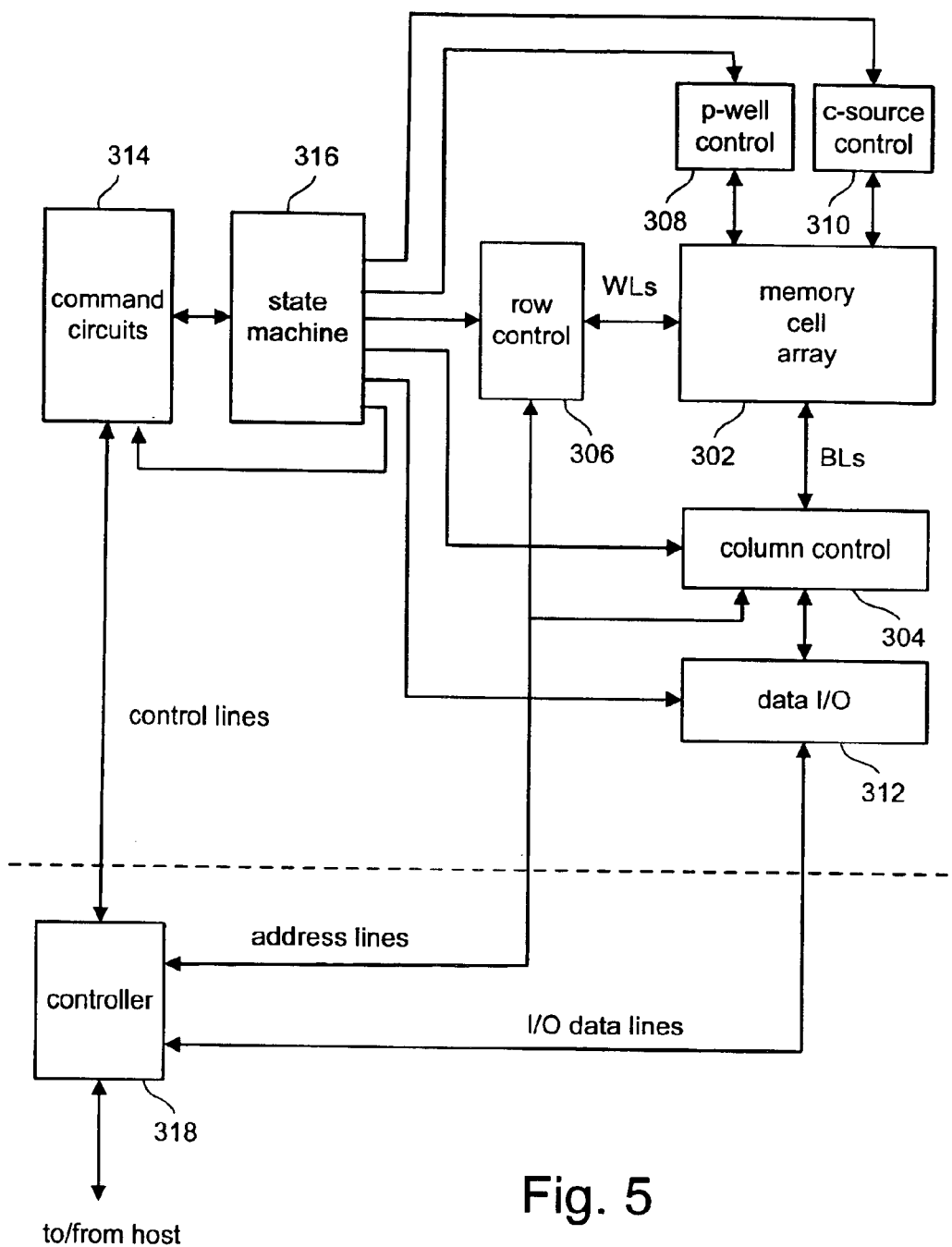
FIG. 5 is a block diagram of one embodiment of a non-volatile memory system in which the various aspects of the present invention are implemented.

FIG. 5 is a block diagram of one embodiment of a flash memory system that can be used to implement the present invention. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote the programming or to inhibit the programming. Row control circuit 306 is connected to the word lines to select one of the word lines, to apply read voltages, to apply program voltages and to apply an erase voltage. C-source control circuit 310 controls a common source line (labeled as "C-source" in FIG. 6) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred to state machine 316, which controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected or connectable with a host system such as a personal computer, a digital camera, personal digital assistant, etc. Controller 318 communicates with the host in order to receive commands from the host, receive data from the host, provide data to the host and provide status information to the host. Controller 318 converts commands from the host into command signals that can be interpreted and executed by command circuits 314, which is in communication with state machine 316. Controller 318 typically contains buffer memory for the user data being written to or read from the memory array.

One exemplar memory system comprises one integrated circuit that includes controller 318, and one or more integrated circuit chips that each contain a memory array and associated control, input/output and state machine circuits. The trend is to integrate the memory arrays and controller circuits of a system together on one or more integrated circuit chips. The memory system may be embedded as part of the host system, or may be included in a memory card (or other package) that is removably inserted into the host systems. Such a removable card may include the entire memory system (e.g. including the controller) or just the memory array(s) and associated peripheral circuits (with the Controller being embedded in the host). Thus, the controller can be embedded in the host or included within a removable memory system.

Figure 6:
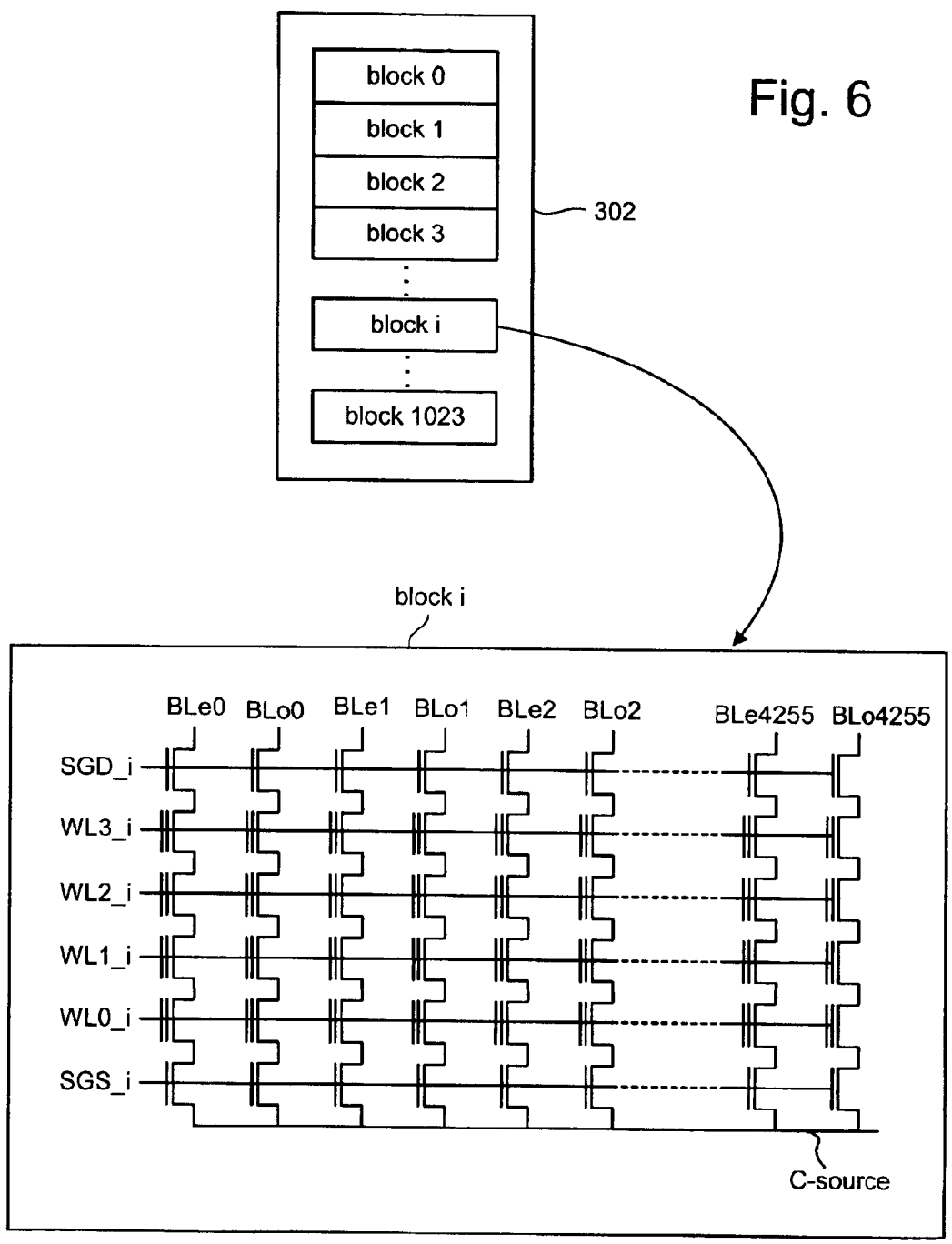
FIG. 6 illustrates an example of an organization of a memory array.

With reference to FIG. 6, an example structure of memory cell array 302 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 6 shows four memory cells connected in series to form a NAND string. Although four cells are shown to be included in each NAND string, more or less than four can be used. One terminal of the NAND string is connected to corresponding bit line via a first select transistor SGD, and another terminal is connected to c-source via a second select transistor SGS.

During read and programming operations, 4,256 memory cells are simultaneously selected. The memory cells selected have the same word line and the same kind of bit line (e.g. even bit lines). Therefore, 532 bytes of data can be read or programmed simultaneously. These 532 bytes of data that are simultaneously read or programmed form a logical page. Therefore, one block can store at least eight logical pages (four word lines, each with odd and even pages). When each memory cell stores two bits of data (e.g. a multi-level cell), one block stores 16 pages. Other sized blocks and pages can also be used with the present invention.

Memory cells are erased by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative.

In the read and verify operations, the select gates (SGD and SGS) and the unselected word lines (e.g., WL0, WL1 and WL3) are raised to a read pass voltage (e.g. 4.5 volts) to make the transistors operate as pass gates. The selected word line (e.g. WL2) is connected to a voltage, a level of which is specified for each read and verify operation in order to determine whether a threshold voltage of the concerned memory cell has reached such level. For example, in a read operation for a two level memory cell, the selected word line WL2 may be grounded, so that it is detected whether the threshold voltage is higher than 0V. In a verify operation, the selected word line WL2 is connected to 2.4V, for example, so that it is verified whether the threshold voltage has reached at least 2.4V. The source and p-well are at zero volts. The selected bit lines (BLe) are pre-charged to a level of, for example, 0.7V. If the threshold voltage is higher than the read or verify level, the potential level of the concerned bit line (BLe) maintains the high level because of the non-conductive memory cell. On the other hand, if the threshold voltage is lower than the read or verify level, the potential level of the concerned bit line (BLe) decreases to a low level, for example less than 0.5V, because of the conductive memory cell (M). The state of the memory cell is detected by a sense amplifier that is connected to the bit line. The difference between whether the memory cell is erased or programmed depends on whether or not negative charge is stored in the floating gate. For example, if negative charge is stored in the floating gate, the threshold voltage becomes higher and the transistor can be in enhancement mode.

The erase, read and verify operations described above are performed according to techniques known in the art. Thus, many of the details explained can be varied by one skilled in the art.

Figure 7:
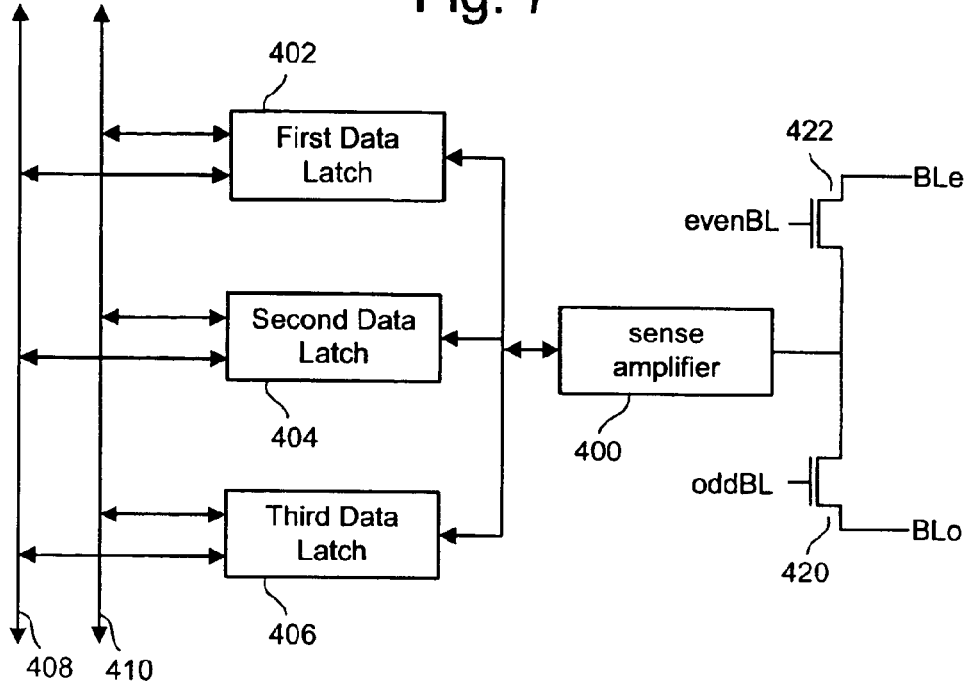
FIG. 7 depicts a portion of the column control circuit.

FIG. 7 depicts a portion of column control circuit 304 of FIG. 5. Each pair of bit lines (e.g. BLe and BLo) is coupled to a sense amplifier. The sense amplifier is connected to three data latches: first data latch 402, second data latch 404 and third data latch 406. Each of the three data latches is capable of storing one bit of data. The sense amplifier senses the potential level of the selected bit line during read or verify operations, stores the sensed data in a binary manner, and controls the bit line voltage during the program operation. The sense amplifier is selectively connected to the selected bit line by selecting one of signals of "evenBL" and "oddBL." Data latches 402, 404 and 406 are coupled to I/O lines 408 to output read data and to store program data. I/O lines 408 are connected to data input/output buffer 312 of FIG. 5. Data latches 402, 404 and 406 are also coupled to status line(s) 410 to receive and send status information. In one embodiment, there is a sense amplifier, first data latch 402, second data latch 404 and third data latch 406 for each pair (even and odd) of bit lines.

Figure 8:
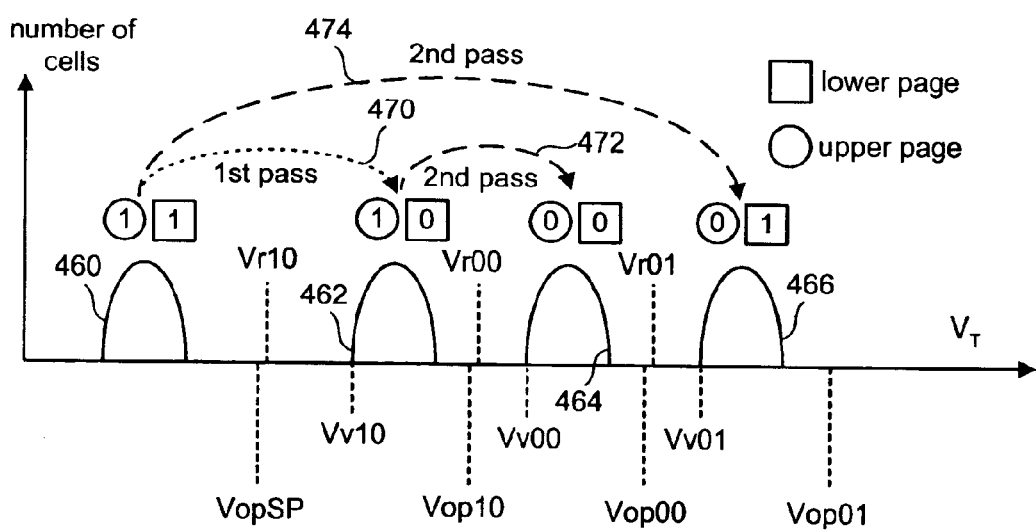
FIG. 8 depicts memory cell threshold distributions and illustrates one example of a technique for programming multi-state memory cells.

FIG. 8 illustrates threshold voltage distributions for memory cells storing two bits of data (e.g. four data states). Distribution 460 represents a distribution of threshold voltages of cells that are in the erased state (storing "11"), having negative threshold voltage levels. Distribution 462 represents a distribution of threshold voltages of cells that are storing "10." Distribution 464 represents a distribution of threshold voltages of cells that are storing "00." Distribution 466 represents a distribution of threshold voltages of cells that are storing "01." Each of the two bits stored in a single memory cell, in this example, is part of a different logical page. The bit displayed in the square corresponds to a lower page. The bit displayed in the circle corresponds to an upper page. In one embodiment, these logical states are assigned to the physical states using a gray code orientation (11, 10, 00, 01) so that if the threshold voltage of a floating gate erroneously shifts, only one bit will be affected. Although FIG. 8 shows four states, the present invention can be used with less than or greater than four states.

In order to provide improved reliability, it is better for the individual distributions to be tightened (distribution narrowed), because the tighter distribution brings a wider read margin (distance between states). According to the article "Fast and Accurate Programming Method for Multi-level NAND EEPROMs, pp 129–130, Digest of 1995 Symposium on VLSI Technology," which article is incorporated herein by reference, in principle, limiting a distribution to a 0.2V-width requires that the usual repetitive programming pulses be incremented 0.2V between steps. To tighten the distribution within a 0.05V-width, a 0.05V step is required. Programming cells with such small step increments in programming voltage results in increasing the programming time.

FIG. 8 illustrates an example of a two pass technique of programming a 4-state NAND memory cell. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be within threshold voltage distribution 462, as shown by arrow 470. That concludes the first programming pass.

In a second programming pass, the cell's threshold voltage level is set according to the bit being programmed into the upper logical page. If the upper logical page bit is to store a logic "1," then no programming occurs since the cell is in one of the states corresponding to threshold voltage distributions 460 or 462, depending upon the programming of the lower page bit, both of which carry an upper page bit of "1." If the upper page bit is to be a logic "0," then the threshold voltage is shifted. If the first pass resulted in the cell remaining in the erased state corresponding to threshold distribution 460, then in the second phase the cell is programmed so that the threshold voltage is increased to be within threshold voltage distribution 466, as depicted by arrow 474. If the cell had been programmed into the state corresponding to threshold distribution 462 as a result of the first programming pass, then the memory cell is further programmed in the second pass so that the threshold voltage is increased to be within threshold voltage distribution 464, as depicted by arrow 472. The result of the second pass is to program the cell into the state designated to store a logic "0" for the upper page without changing the data for the lower page.

Note that although specific bit patterns have been assigned to each of the distributions, different bit patterns may be so assigned, in which case the states between which programming occurs can be different than those depicted in FIG. 8.

Normally, the cells being programmed in parallel are alternate cells are along a word line. For example, FIG. 4 illustrates three memory cells 224, 244 and 250 of a much larger number of cells along word line WL2. One set of alternate cells, including cells 224 and 250, store bits from logical pages 0 and 2 ("even pages"), while another set of alternate cells, including cell 244, store bits from logical pages 1 and 3 ("odd pages"). In the above example, logical pages 0 and 1 are lower pages and logical pages 2 and 3 are upper pages.

Note that FIG. 8 also shows read compare points and verify compare points. For example, the read compare points include Vr10, Vr00, and Vr01. During a read operation, voltages corresponding to Vr10, Vr00, and Vr01 are applied to the control gate of a memory cell to determine at what point the memory cell conducts and doesn't conduct. Based on the three read operations, the memory system can determine which threshold distribution (e.g. which state) the memory cell is in. For example, if the memory cell does not conduct for any of the three read operations, the memory cells in state 01. If the memory cell only conducts when applying Vr01 to the control gate, the memory cells in state 00. If the memory cell conducts when applying Vr00 and not when applying Vr10, then the memory cell is in state 10. If the memory cell conducts when applying Vr10, Vr00, and Vr01, then the memory cells in state 11. In one embodiment, each of the read compare points Vr10, Vr00, and Vr01 are midpoints between adjacent states of threshold distributions. Verify compare points Vr10, Vr00 and Vr01 are used during the programming process to determine if a cell has been sufficiently programmed.

FIG. 8 also show over programming verify compare points VopSP, Vop10, Vop00, and Vop01. These over programming verify compare points are used to determine whether a particular memory cell has been over programmed. For example, by applying VopSP to the control gate of a memory cell intended to be in state 11, it can be determined that the cell is over programmed (over soft programmed) if the cell does not conduct. If the cells intended to be in state 10, it can be concluded that the cell is over programmed if the cell does not conduct (e.g. turn on) when applying Vop10 to the control gate of the cell. When the cell is supposed to be in state 00, if the memory cell does not conduct when Vop00 is applied to the control gate, then the cell has been over programmed. When the cell was programmed to state 01, it can be concluded that the cell is over programmed if the cell does not conduct if Vpo01 is applied to the control gate. Each of the over programming verify compare points are slightly below the neighboring read compare points. For example, in one embodiment, they are 50 mV lower. In other embodiments, the verify compare points may differ by more or less than 50 mV from the neighboring read compare points. In one embodiment, the over program verification process is performed by state machine 316.

In one embodiment of the programming process, memory cells are first erased (in blocks or other units) prior to lower page programming. When the programming process begins, a data load or write command will be received by the controller from the host. The controller will issue appropriate commands to data input/output buffer 312 and state machine 316. Controller 318 will receive an address to write the data to. This address will be mapped to a particular logical page (or pages) and physical address in memory cell array 302. The address data will be sent from controller 318 to data input/output buffer 312 and, in some embodiments, state machine 316. Data is then sent to the appropriate first data latches 402 based on the address for the program operation(s). Data from the first data latches 402 is loaded in the corresponding second data latches 404. In response to the program command from the controller, state machine 316 then begins the program process described by the flowchart of FIG. 9.

In step 594, state machine 316 determines whether data is being written to the upper page or the lower page. If data is being written to the lower page, the process continues at step 600. If data is being written to the upper page, then the state machine performs a lower page read operation to determine the lower page data in step 596. Looking back at FIG. 8, an upper page program includes programming the memory cell to either state 00 or state 01. If the lower page data is a logic "1," then the upper page program process includes programming the memory cell to state 01 (see arrow 474 of FIG. 8). If the lower page data is a logic "0," then the upper page program process includes programming the memory cell to state 00 (see arrow 472 of FIG. 8). Thus, the system needs to know the lower page data in order to determine which state the memory cell must be programmed to during the upper page program process.

In one embodiment of step 596, the state machine performs a read operation at Vr10. If the memory cell conducts (turns on), then the read data for the lower page is "1." If the memory cell does not conduct (does not turn on), then the read data for the lower page is "0." The lower page data is then stored in third data latch 406. Note that other read processes can be used to read the lower page data and the lower page data can be stored in locations other than third data latch 406. After storing the lower page data in third data latch 406, the process continues at step 600.

In step 600, the state machine will apply a program pulse to the appropriate word line(s). Prior to the first pulse being driven, the program voltage is initialized to a starting pulse (e.g. 12 volts), and a program counter maintained by the state machine is initialized at 0. In the first iteration of step 600, the first program pulse is applied to the selected word line. If a logic "0" is stored in a particular first data latch, then the corresponding bit line for that memory cell is grounded. On the other hand, if logic "1" is stored in the first data latch for a particular memory cell, then the corresponding bit line is connected to Vdd to inhibit programming. More information about inhibiting programming can be found in U.S. patent application Ser. No. 10/379,608, filed on Mar. 5, 2003, titled "Improved Self Boosting Technique," incorporated herein by reference in its entirety.

In step 602, the selected memory cells are verified. If it is detected that the target threshold voltage of a selected cell has reached its target level (e.g. by comparing the output of the sense amplifier to the second data latch), then the data stored in second data latch 404 is changed to logic "1." If it is detected that the threshold voltage has not reached the appropriate level, the data stored in second data latch 404 is not changed. In this manner, a memory cell having a logic "1" stored in the corresponding second data latch 404 does not need to be programmed. When all of the second data latches store logic "1," the state machine (via line 410) knows that all selected cells have been programmed. Thus, step 604, includes checking whether all of the second data latches 404 are storing logic "1." If so, the first stage of programming is complete and an appropriate status message is reported in step 610.

If, in step 604, is determined that not all second data latches 404 are storing logic "1," then the programming process continues. In step 606, the program counter is checked against a program limit value. One example of a program limit value is 20. If the program counter is not less than 20 (e.g. the maximum number of program tries have been performed), then the program process has failed (step 608) and an appropriate status message is reported. If the program counter is less than the maximum value, then the programming voltage level is increased by the next step size, the program counter is incremented and the programming process continues at step 600 to apply the next pulse.

If the verification step was successful in step 604, then each of the memory cells programmed should have a threshold voltage in one of the distributions depicted in FIG. 8. However, the previously discussed process only verified that the threshold voltage of the cell being programmed was the least as high as the appropriate verification compare point. The verification compare point used in step 602 is the lowest acceptable voltage level in the target threshold distribution. For example, looking at FIG. 8, the verification compare point for step 604 for verifying that a cell was programmed into state 10 is Vv10, the verification compare point for programming into state 00 is Vv00, and the verification compare point for programming into state 01 is Vv01. Thus, the process described above verifies that the program process does not undershoot the desired state. Up to this point, there has been no check to see if the programming process overshot the desired state. For example, if a memory cell was intended to be programmed into state 10 and the threshold voltage of that memory cell was programmed to any value above Vop10, then the memory cell was over programmed. Steps 620–676 are used determine whether the programming process over programmed the memory cell.

Figure 9:
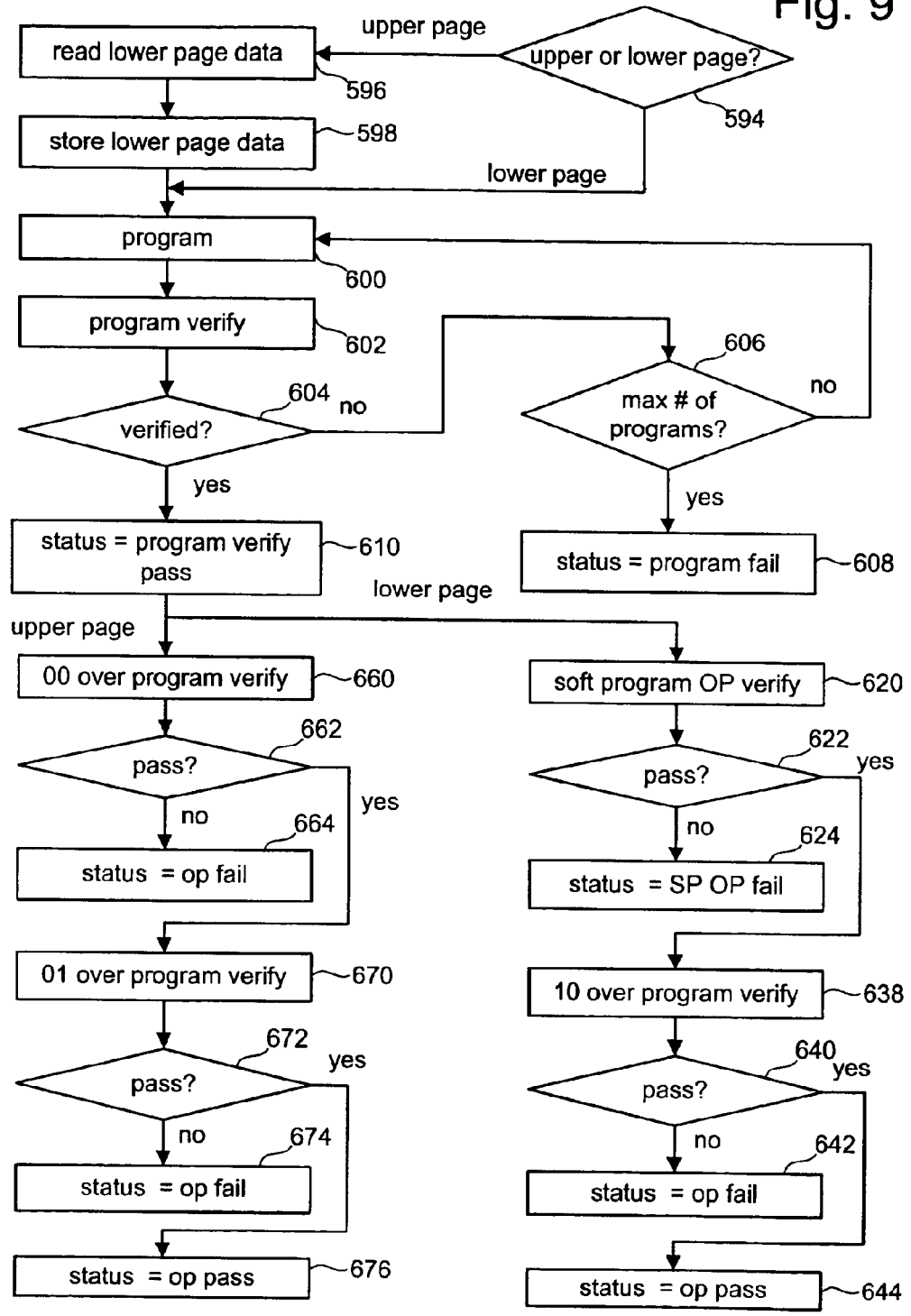
FIG. 9 is a flow chart describing one embodiment of a process for programming a memory array.

After step 610, the process of FIG. 9 splits into two parallel paths. If the program process programmed the lower page then the process performs step 620–644. If the programming process programmed the upper page, then the process performs steps 660–676. It is possible that some cells will have a lower page programmed and other cells during the same programming process will have upper page programmed. Thus, different sets of steps may be performed for different memory cells. In another embodiment, step 620–644 and step 660–676 can be performed for every cell being programmed regardless whether the lower page or upper page is being programmed.

If the lower page is being programmed then 620 is performed. Step 620 includes a soft program over program verification process. That is, step 620 includes performing a process that determines whether the soft programming process performed after or as part of an erase process raised the threshold voltage above the acceptable values for an erased memory cell. When a memory cell is erased, it is possible that the threshold voltage for the erased memory cell is too low. To remedy a threshold voltage that is too low, a soft programming process if performed to raise the threshold voltage of the erased memory cell to an acceptable level. It is possible that the soft programming process raised the threshold voltage too far so that the memory cell becomes over programmed (e.g. the threshold voltage becomes greater than VopSP). Step 620 detects such over programmed cells. In step 622, it is determined whether the various cells passed the soft program over program verification process of 620. If all of the cells do not pass, then a status will be returned in step 624 indicating that the soft program over program verification failed. If the process of step 620 passed (because no cells were over programmed during the soft programming process), then the state 10 over program verification process is performed in step 638.

Step 638 includes performing the state 10 over programming verification process. The state machine determines whether a cell that is intended to be in state 10 has a threshold voltage greater than Vop10. If so, the cell does not pass the test (step 640) and a status is returned indicating that there is an over programming failure (step 642). In one embodiment, the status can include indicating that it is a state 10 over programming failure. In another embodiment, the magnitude of the threshold voltage above the acceptable level can be also be returned. If the process of step 638 does not identify a memory cell that is over programmed, a status of "pass" is returned in step 644. In alternative embodiments of step 644, the process can return that there was a state 10 over programming verification pass.

If the upper page was programmed, then the process performs a state 00 over program verification process in step 660. The system checks to determine whether the threshold voltages of the memory cells intended to be in state 00 are greater than Vop00. If the cells do not pass (because a memory cell intended to be in state 00 has a threshold voltage greater than Vop00), then a status indicating over programming failure will be provided in step 664. In an alternative embodiment, the status can indicate that it is a state 00 over programming failure. If it is determined that the cells are not over programmed, then the process loops to step 670 and performs the state 01 over program verification process.

In step 670, the system determines whether a cell that is intended to be in state 01 has a threshold voltage greater than Vop01. If the cell was intended to be in state 01 and the threshold voltage is greater than the verify compare point Vop01, then the cell fails the test and a status of failure is reported in step 674. If all of the cells pass the test (because they are not over programmed or are not in state 01), then a status of pass will be reported in step 676. In one embodiment, step 670–676 can be omitted.

Figure 10:
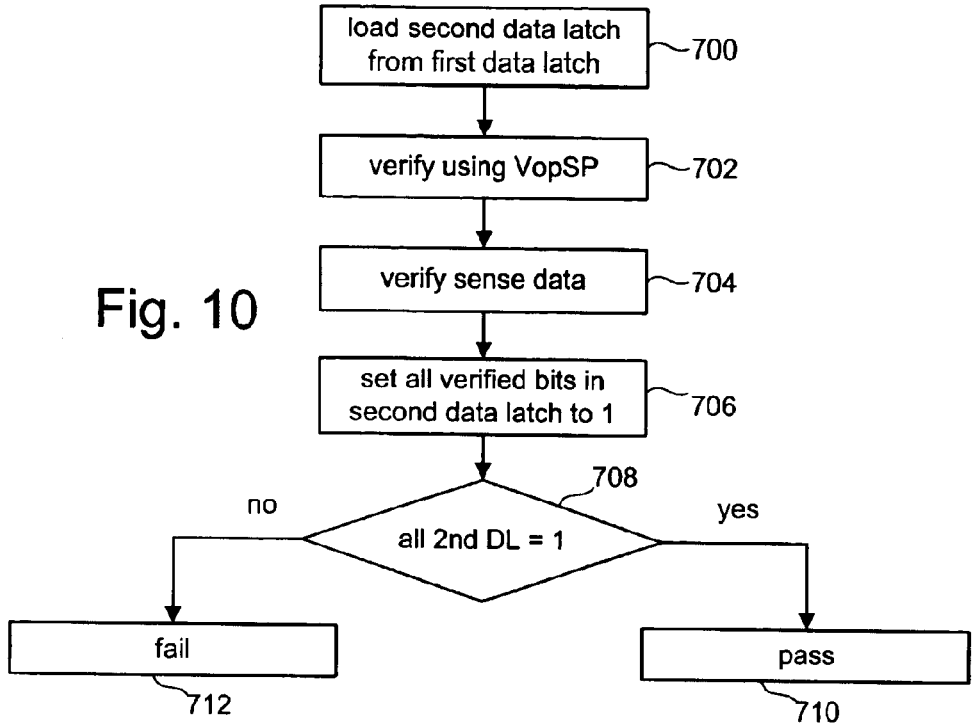
FIGS. 10–13 are flow charts describing one embodiment of a set of processes for performing over program detection.

FIG. 10 is a flowchart describing one embodiment of the process for performing soft programming over program verification (step 620 of FIG. 9). In step 700, the data which was previously programmed into the memory cell still exists in the first data latch 402. This data is loaded from first data latch 402 into second data latch 404 for that memory cell. In step 702, a verification process is performed using VopSP. That is, the system can perform a read operation where the control gate receives the voltage VopSP. If the memory cell conducts, the sense amplifier returns a logic 1. If the cell does not conduct, then the sense amplifier returns a logic 0. If the verify data matches the data in second data latch 404 (step 704), the data in second data latch 404 is set to 1 (step 706). Steps 700–706 are performed in parallel for each of the cells. If all of the second data latches for the memory cells are set to 1 (step 708), then the soft program over program verification process return a result of "pass" (step 710). If not all the second data latches 404 are set to 1, then the process fails (step 712). Note that if the cell was in state 10, then the data loaded into the second data latch in step 700 would be a logic 0, the verification step 702 would apply the VopSP voltage, the transistor would not conduct and the sense data would indicate a 0. Thus, the read data would match the data in second data latch 404, second data latch 404 would be set to logic 1, and the process would still pass.

Figure 11:
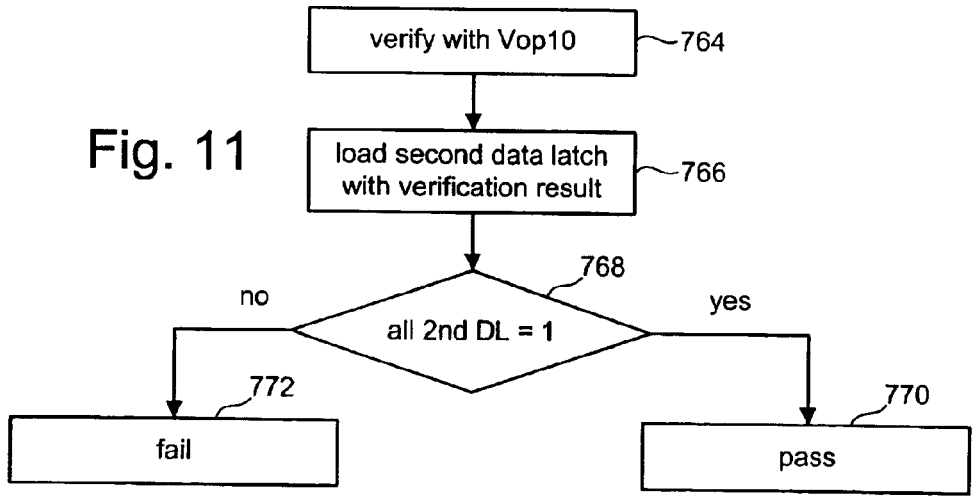

FIG. 11 is a flowchart describing a process for performing state 10 over program verification (step 638 of FIG. 9). In step 764 of FIG. 11, the system performs a verification process using Vop10. That is, a read operation is performed with Vop10 applied to the control gate of the various memory cells. If a cell is in state 11 or 10, and not over programmed, then the cell should conduct; therefore, a logic 1 should be received. In step 766, second data latch 404 is loaded with the results from the verification step. If all the cells were not over programmed, they all should have a logic 1 stored in their respective second data latches. If all the second data latches are at logic 1 (step 768), then the process passes (step 770). If not all second data latches are at logic 1, then the process fails (step 772).

Figure 12:
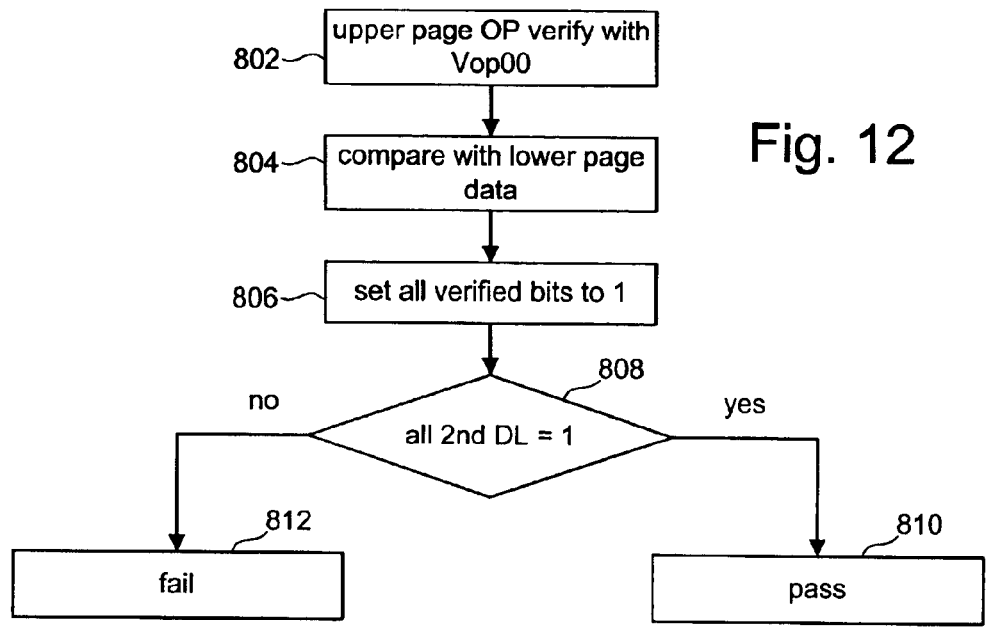

FIG. 12 is a flowchart describing one embodiment of a process for performing the state 00 over program verification process (step 660 of FIG. 9). In step 802 of FIG. 12, a verification process is performed using Vop00. That is, a read operation is performed with Vop00 being applied to the control gates of the memory cells. In one embodiment, if the threshold voltage of a memory cell is greater than Vop00, then the memory cell will not turn on and a logic "0" will be returned. If the threshold voltage of a memory cell is lower than Vop00, then the memory cell will turn on and a logic "1" will be returned. The results returned from the verification of step 802 are stored in the appropriate second data latches 404. In step 804, the system will compare the results of verification step 802 with the lower page data stored in the third data latches 406. The process of FIG. 12 is being performed after an upper page program. As described above, the upper page program starts by reading the lower page data and storing the lower page data in third data latch 406 (see steps 596 and 598). The lower page data stored in the third data latch is compared to the results of the verify step 802.

After an upper page program, the state machine needs to know whether the memory cell should be in state 00 or state 01. The lower page data provides that information. If the lower page data is 0, that means that the memory cell was in state 10 prior to upper page programming. If the memory cell was in state 10, then performing an upper page program moves the memory cell to state 00 (see arrow 472 of FIG. 8). If the lower page data is 1, that means that the memory cell was in state 11 prior to upper page programming. If the memory cell was in state 11, then performing an upper page program moves the memory cell to state 01 (see arrow 474 of FIG. 8). Thus, the state machine knows that if the lower page data was logic "0," then it needs to check to see if the memory cell is over programmed. If the lower page data was logic "1" then the memory cell can not be in state 00 and, therefore, the state 00 over program verification cannot fail.

In one embodiment, a memory cell is determined to be over programmed in step 806 if the lower page data in third data latch 406 is logic "0" and the result returned from the verification of step 802 that is stored in second data latch 404 is logic "0." This scenario indicates that the memory cell should be in state 00; however, the threshold voltage is greater than Vop00. If the lower page data is logic "1" or the result returned from the verification process of step 802 that is stored in the second data latch 404 is logic "1," then the memory cell is verified to not be over programmed with respect to state 00. In step 806, for each memory cell that is not over programmed with respect to state 00, the associated second data latch 404 is set to logic "1." Note that if the upper page program process intended to keep the upper page at logic 1 (e.g. either state 11 or state 10), then the respective second data latch would already be at logic "1." If all second data latches 404 are set to logic "1" (step 808), then the process of FIG. 12 passes (step 810). If not all second data latches 404 are set to logic "1," then the process of FIG. 12 fails (step 812) because there are one or more memory cells that are over programmed with respect to state 00.

Figure 13:
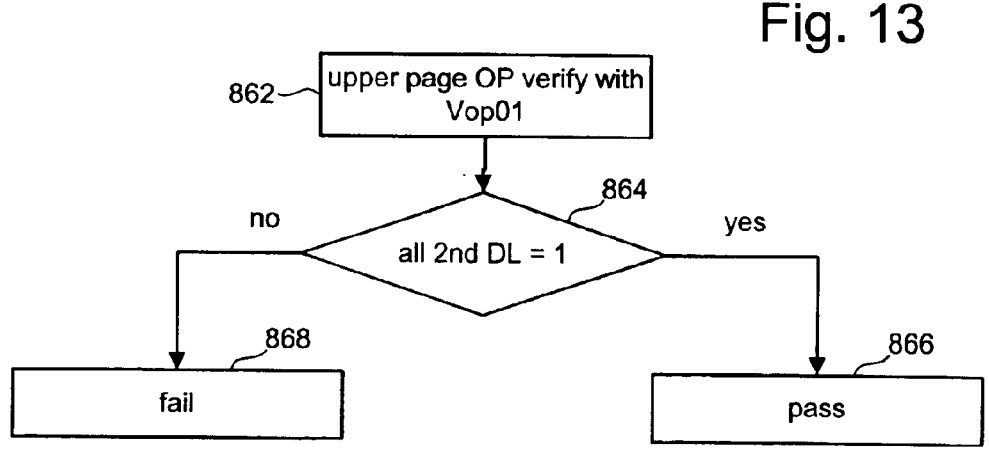

FIG. 13 is a flowchart describing one example of a process for performing the upper page over program verification process for state 01 (step 670 of FIG. 9). In step 862, a verification process is performed using the compare point Vop01. If the cell conducts (a verification result of logic 1 is returned), then second data latch 404 is set to logic "1;" otherwise, second data latch 404 is set to logic "0." If all the second data latches are set to 1 (step 864), then the process of FIG. 13 passes (step 866). If not all the second data latches are set to logic "1," then the process of FIG. 13 does not pass (step 868).

Note that the above-described flowcharts assume that verification process is performed by applying a particular voltage to the control gate and determining whether the memory cell turns on or off. However, there are other means of verifying (and reading) a memory cell to determine the state that can also be used within the spirit of the present invention. For example, a current-sensing system can be used in which a current of the storage unit under a certain read condition is compared with a set of reference currents. In another embodiment, state of a storage unit can be determined using a number of different parameters. For example, the determination of a cell's stored charge level can be performed by current sensing, where the magnitude of its conduction, using fixed bias conditions, is sensed. Alternatively, such determination can be made through sensing threshold voltages, where the onset of such conduction is sensed using various steering gate bias conditions. Alternatively, the determination can be performed dynamically by having the cell's charge-level determined driver-strength control the discharge rate of a dynamically held sense node (by, e.g. a pre-charged capacitor). By sensing the time to reach a given discharge level, the stored charge level is determined. In this case, the parameter indicative of the cells condition is a time. This approach is described in U.S. Pat. No. 6,222,762, incorporated herein by reference in its entirety. Another alternative technique is one in which the state of the storage unit is determined using frequency as the parameter, as described in U.S. Pat. No. 6,044,019, which is hereby incorporated by reference in its entirety. Current sensing approaches are more fully developed in U.S. Pat. No. 5,172,338, which also is incorporated by reference in its entirety.

Shifts in the apparent charge stored on a floating gate can occur because of the existence of an electric field resulting from the charge on adjacent floating gates. A difficulty is that adjacent memory cells can be either programmed or erased at a time after the present cell now being read was programmed. For example, consider that one set of cells is programmed to add a level of charge to their floating gates to correspond to one set of data. After a second set of cells (adjacent to the first set of cells) is programmed with a second set of data, the charge levels read from the floating gates of the first set of cells sometimes appears to be different than programmed because of the effect of the electric field from the second set of floating gates. That is, observed errors can be due to the influence of electric field from adjacent floating gates upon the apparent voltage level of the floating of the cell being read. This is known as the Yupin effect, and is described more fully in U.S. Pat. Nos. 5,867,429 and 5,930,167, which patents are incorporated herein by reference in their entirety. These patents describe either physically isolating the two sets of floating gates from each other or taking into account the effect of the charge on the second set of floating gates when reading the first set of floating gates.

It is possible that a first set of memory cells are programmed correctly, but when adjacent cells are subsequently programmed, the Yupin effect causes the first set of memory cells to appear to be over programmed. For example, a first cell intended to be programmed to state 10 (see FIG. 8) will be checked to verify that the threshold voltage for that cell is above Vv10 (program verify) and below Vop10 (over program verify). After an adjacent memory cell is programmed, it is possible that the threshold voltage read from the first cell may appear to be higher that originally programmed (e.g. 0.2 volts higher). If the first memory cell was programmed to a voltage threshold just below Vop10, than after the adjacent cell is programmed the first cell has an apparent threshold voltage that is greater than Vop10. Therefore, the first memory cell is over programmed. It is possible that the apparent threshold voltage is greater than read compare point (e.g. Vr00), thereby, causing a data error. Note that the adjacent cell may be on an adjacent word line or an adjacent bit line. For example, in FIG. 4 cell 244 is adjacent to cells 224, 242, 250 and 246. In some implementations, memory cells that are not adjacent to cell 244 may have an electric field that effects the apparent charge read from cell 244.

To account for this Yupin effect, after programming using a first control line (e.g. word line or bit line), one set of embodiments of the present invention will perform the over program verification checks on the page(s) that have previously been programmed and are associated with the control line(s) adjacent to the first control line. Such embodiments are described by FIGS. 14A–15C.

Figure 14A:
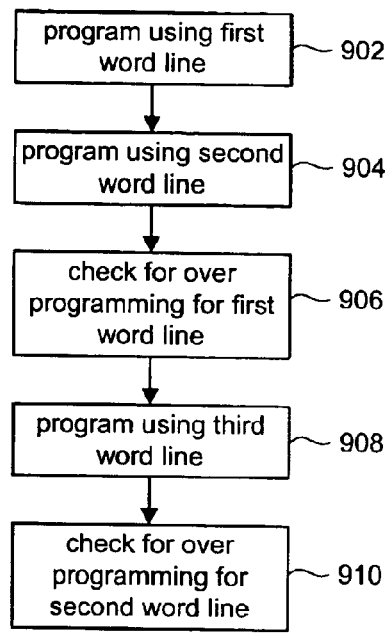
FIGS. 14A and 14B are flow charts describing two embodiments of processes for programming and performing over program detection.

FIG. 14A describes one embodiment of a process for performing the over program verification on a logical page associated with the previously selected word line. In step 902 of FIG. 14A, a set of memory cells are programmed using a first word line. For example, looking at FIG. 4, a logical page can be programmed using word line WL1. The process of step 902 includes performing the process of FIG. 9, including checking for over programmed memory cells as described above with respect to FIGS. 10–13. In step 904, a second set of program operations is performed for memory cells using a second word line (e.g. word line WL2 of FIG. 4). The process of step 904 includes performing the process of FIG. 9, including checking for over programmed memory cells. In step 906, the system checks for over programming due to the above-described Yupin effect for the memory cells of the logical pages associated with the first word line (e.g. word line WL1). In step 908, the system will program a third set of memory cells using a third word line (e.g. word line WL3). The process of step 908 includes performing the process of FIG. 9, including checking for over programmed memory cells. In step 910, the system checks for over programming due to the above-described Yupin effect for the logical pages associated with the second word line (e.g. WL2). The process can then continue (or not continue) programming additional memory cells associated with additional word lines and checking for over programmed memory cells for previously programmed word lines.

Note that in some implementations, word lines are programmed in order along the NAND string; therefore, after a first word line is used to program, the next program operation uses the word line adjacent the first word line. A NAND string is typically (but not always) programmed from the source side to the drain side, for example, from memory cell 228 to memory cell 222 (see FIG. 4). Thus, after using WL0 to program, the system will next use WL1 (which is adjacent to WL0). Therefore, in the example of FIG. 14A, the over program verification will be performed for the immediately preceding word line. However, in other embodiments, other previously programmed memory cells can be checked rather than the immediately preceding programmed memory cells.

Figure 14B:
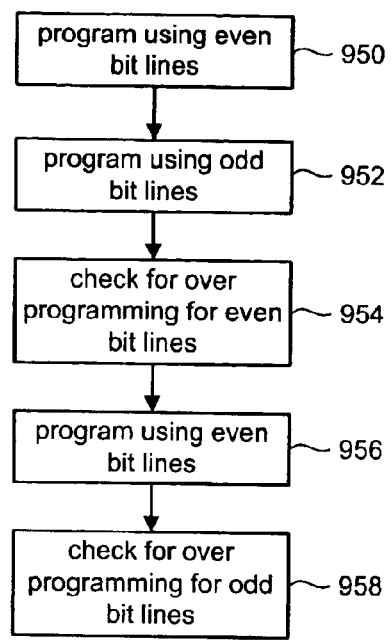

FIG. 14B provides a flowchart describing a process of one embodiment for accounting for the Yupin effect by checking for over programmed memory cells for the previously selected bit lines. In one embodiment, the bit lines are grouped into odd bit lines and even bit lines. Odd bit lines are programmed followed by even bit lines being programmed, followed by odd bit lines, followed by even bit lines, etc. In other embodiments, different sets of bit lines can be used in different programming operations. FIG. 14B contemplates that after programming with one set of bit lines, a check will be performed for over programming with respect to the other set of bit lines previously programmed. In step 950, a programming operation will be performed using even bit lines. The process of step 950 includes performing the process of FIG. 9, including checking for over programmed memory cells as described above with respect to FIGS. 10–13. In step 952, programming operation will be performed using odd bit lines. The process of step 952 includes performing the process of FIG. 9, including checking for over programmed memory cells. In step 954, the system checks for over programming due to the above-described Yupin effect for the logical pages associated with the previously programmed even bit lines. In step 956, programming will be performed using the even bit lines. The process of step 956 includes performing the process of FIG. 9, including checking for over programmed memory cells. In step 958, the system checks for over programming due to the above-described Yupin effect for the logical pages associated with the previously programmed odd bit lines. This process can continue with the alternating of programming and checking for over programming on previous bit lines.

The processes of FIGS. 14A and 14B can be performed by the state machine, the controller, specific logic for implementing those processes or a combination of the above.

Figure 15A:
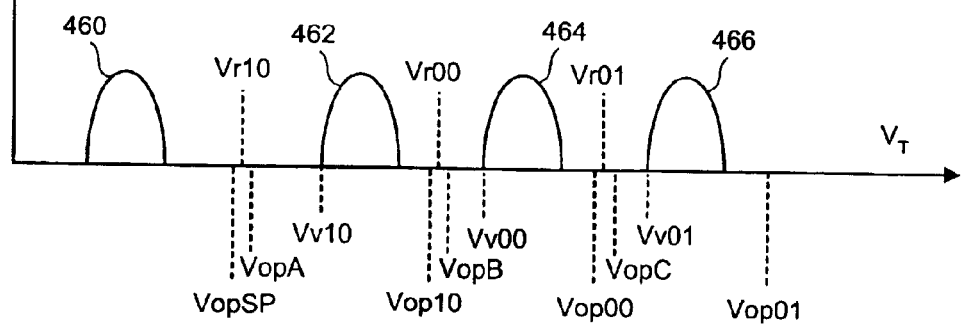
FIG. 15A depicts memory threshold distributions.
Figure 15B:
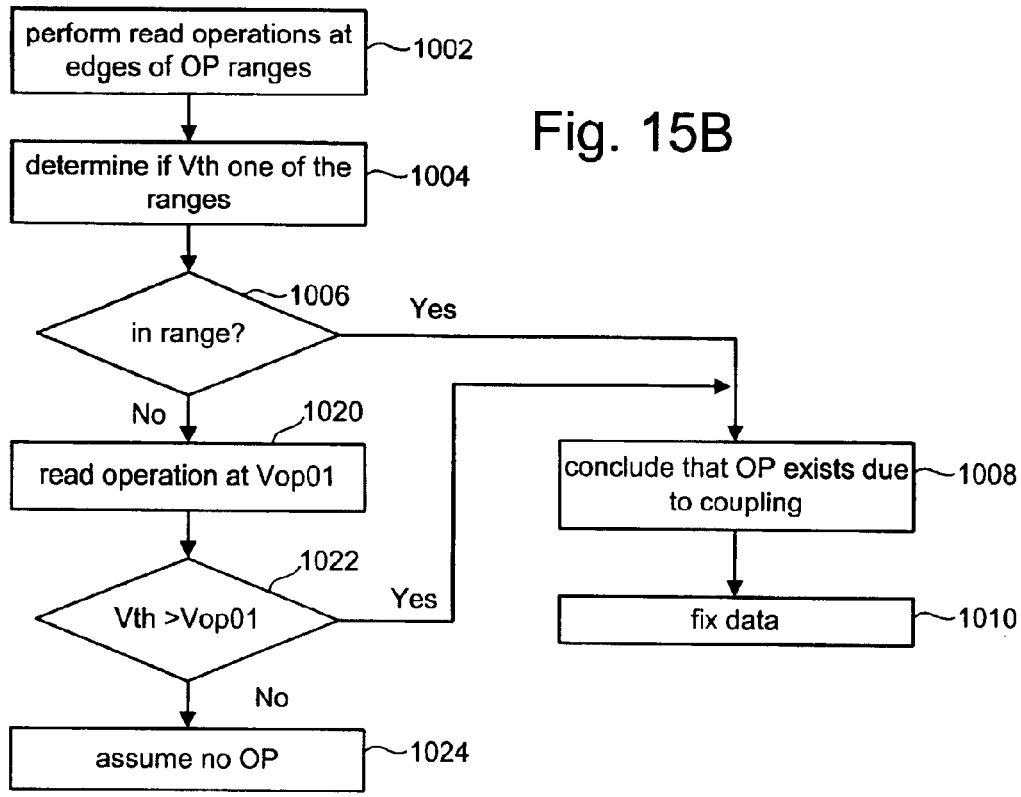
FIGS. 15B and 15C are flow charts describing two embodiments of processes for performing over program detection.
Figure 15C:
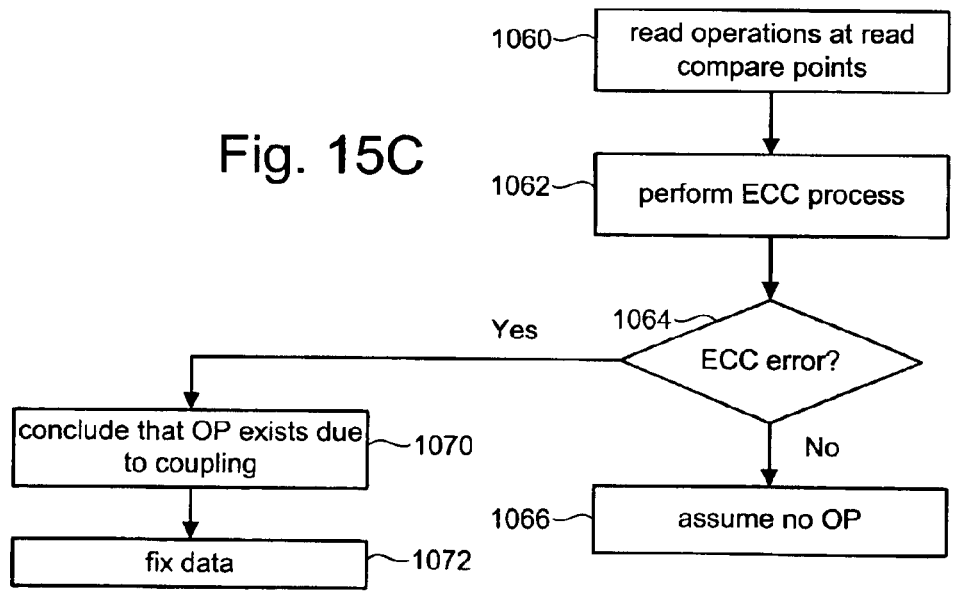

There are many different suitable methods that the system can use to check for over programming due to the above-described Yupin effect for the logical pages associated with the previously programmed control lines as part of the processes of FIGS. 14A and B. FIGS. 15A–C describe two such methods; however, many other suitable methods can also be used.

Similar to FIG. 8, FIG. 15A illustrates threshold voltage distributions 460, 462, 464 and 466 for memory cells storing two bits of data. In addition to the read compare points, (Vr10, Vr00, and Vr01), the verify compare points (Vv10, Vv00, and Vv01) and the over program compare points (VopSP, Vop10, Vop000 and Vop01), FIG. 15A also depicts over program test points VopA, VopB and VopC. After programming a first cell and then an adjacent second cell, the Yupin effect from the second cell will move up the threshold voltage of the first cell by approximately 0.2 volts (could be or more or less than 0.2 volts depending on the technology, size, spacing, etc). That data is not totally corrupted. Rather, it is predictably corrupted. One scenario is if the original programming caused the threshold voltage of the first cell to be just below the over program verify voltage (e.g. just below Vop10) and the cell is then subject to the maximum Yupin effect (e.g. approximately 0.2 volts, or another value as discussed above). Thus, over program regions are established to represent a prediction of where the threshold voltage will be if the cell becomes over programmed because of the Yupin effect. FIG. 15A shoes three over program regions. The first over program region includes the region between VopSP and VopA. The second over program region includes the region between Vop10 and VopB. The third over program region includes the region between Vop00 and VopC. Note that the values of the over program compare points and the over program test points can vary from the values depicted in FIG. 15A.

One process for determining whether a memory cell is over programmed because of the Yupin effect is to test whether the cell's threshold voltage is within one of the over program regions. If a cell's threshold voltage is within an over program region, then the cell is assumed to be over programmed due to the Yupin effect. For example, if a cell's threshold voltage is determined to be in the second over program region, then it is assumed that the cell should have been within distribution 462, but became over programmed due to the Yupin effect. Note that although FIG. 15A depicts four threshold distributions (storing two bits of data) more or less distributions (and bits of data) can also be used when implementing the present invention.

FIG. 15B provides a flow chart describing one embodiment of a process for testing for over programming due to the Yupin effect, as described above. The process of FIG. 15B can be performed as part of the checking for over programming in steps 906, 910, 954 and 958 of FIGS. 14A and 14B. In step 1002, read operations are performed at the edges of each of the over program regions. For example, read operations are performed at VopSP, VopA, Vop10, VopB, Vop00, and VopC. Based on those read operations, it is determined whether the cell's threshold voltage is within any of the over program regions. For example, if the memory cell turns on when Vop10 is applied to the word line and does not turn on when VopB is applied to the word line, then it is assumed that the cell is in the second over program region. If the memory cell's threshold voltage is within one of the over program regions (step 1006), then a conclusion is made (step 1008) that the cell is over programmed due to coupling from an adjacent cell (the Yupin effect). In step 1010, the data for the over programmed cell is fixed. The cell can be partially erased to lower the threshold voltage back into the appropriate distribution, the cell can be completely erased and rewritten, the data can be written to another location, error information can be stored indicating that the cell is over programmed so that future reads will take into account the over programming, or another suitable action can be performed.

If in step 1006 it was determined that the threshold voltage was not in any of the over program regions, then a read operation is performed for over program compare point Vop01. If the threshold voltage of the memory cell is greater than Vop01 (step 1022), then the memory cell will assumed to be over programmed and the process will continue at step 1008. If the threshold voltage of the memory cell is less than Vop01 (step 1022) then it is assumed that the memory cell is not over programmed (step 1024).

FIG. 15C provides a flow chart describing another embodiment of a process for testing for over programming due to the Yupin effect. The process of FIG. 15C can be performed as part of the checking for over programming in steps 906, 910, 954 and 958 of FIGS. 14A and 14B. In step 1060, read operations are performed at each of the read compare points Vr10, Vr00, and Vr01. Based on the read operations, an initial determination is made as to the state of the memory cells. In step 1062 an ECC process is performed according to methods known in the art. If there is no ECC error (step 1064), then it is assumed that the memory cell was not over programmed due to the Yupin effect (step 1066). If an ECC error was detected (step 1064), then it is assumed that the error was caused by the memory cell being over programmed due to the Yupin effect (step 1070). In step 1072, the data is fixed (similar to step 1010 of FIG. 15B). For example, assume that in step 1060 the read operations resulted in a determination that the threshold voltage was greater than Vr00 and less than Vr01. The memory cell is assumed to be in threshold distribution 464, storing logical data 00. If the ECC fails, then it is assumed that the memory cell should be in threshold distribution 462 storing logical data 10; however, the memory cell is over programmed. Thus, in one embodiment of step 1072, the threshold voltage of the memory cell can be corrected to be within threshold distribution 462.

Figures 16, 17, 18:
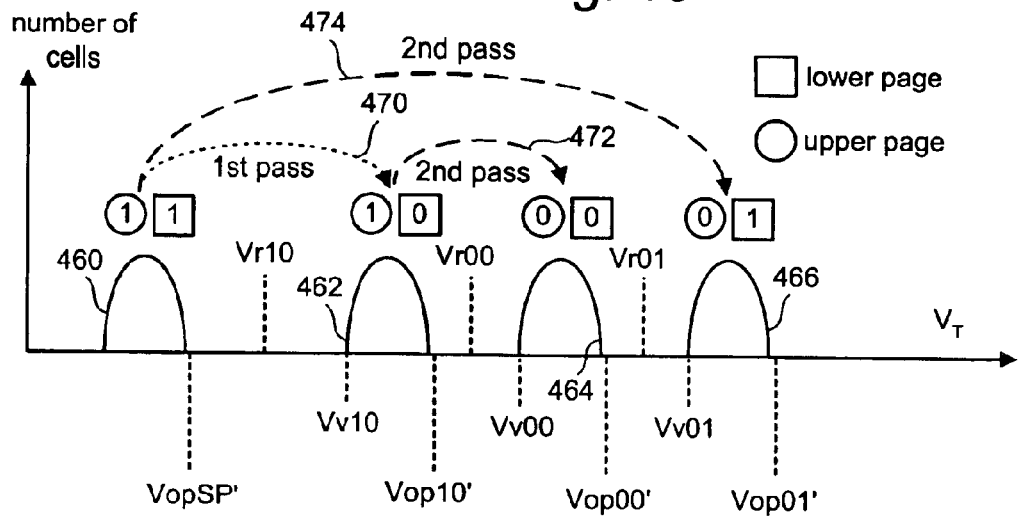

FIGS. 17–22 provide truth tables that, in conjunction with FIG. 16, describe alternative embodiments for performing over program verification. Similar to FIG. 8, FIG. 16 illustrates threshold voltage distributions 460, 462, 464 and 466 for memory cells storing two bits of data. However, FIG. 16 shows different over programming verify compare points VopSP', Vop10', Vop00' and Vop01'. Compare point VopSP' is a slightly greater value than the highest voltage in threshold voltage distribution 460. Vop10' is a slightly greater value than the largest voltage in threshold voltage distribution 462. Vop00' is a slightly greater value than the largest voltage in threshold voltage distribution 464. Vop01' is a slightly greater value than the largest voltage in threshold voltage distribution 466. Note that VopSP' of FIG. 16 is lower than VopSP of FIG. 8, Vop10' of FIG. 16 is lower than Vop10 of FIG. 8, Vop00' of FIG. 16 is lower than Vop00 of FIG. 8, and Vop01' of FIG. 16 is lower than Vop01 of FIG. 8. In other embodiments, other values of the verify compare points VopSP', Vop10', Vop00' and Vop01' above the respective threshold voltage distributions can also be used.

FIG. 17 explains an embodiment for performing soft program over program verification after lower page programming. The truth table of FIG. 17 has two columns corresponding to whether "0" data or "1" data was programmed during the previous lower page programming. The second row of the truth table (Read at VopSP') corresponds to data read from a memory cell being verified for over programming. The third row indicates data stored in second data latch 404. The fourth row indicates data stored in first data latch 402. The fifth row indicates the result of the over programming verification for state 11.

If a "1" was programmed (left hand column of FIG. 17), then the memory cell remains within state 11. If a "0" was programmed, then the cell was intended to be programmed to state 10. The second row of the truth table indicates the results of a read operation that includes applying VopSP' to the control gate of the memory cells. If the threshold voltage of a memory cell being read is greater than VopSP', then the memory cell will not turn on and a logic 0 will be read. If the threshold voltage of the memory cell is less than VopSp', then the memory cell will turn on and a logic 1 will be read. In the column that corresponds to a logic 1 being programmed into the memory cell, the read step will either read a logic "1" (properly programmed) or a logic "0" (over programmed). In the case where the cell was programmed to state 10, the read step will read a logic "0" since the verification step during programming verified that the voltage was at least greater than Vv10. The data read is stored in second data latch 404. First data latch 402 stores the data that was previously programmed into the lower page. The state machine will check the contents of first data latch 402 and second data latch 404. If first data latch 402 is storing a logic "1" and second data latch 404 is storing a logic "0," then the over program test fails. That is, the state machine concludes that the memory cell is over programmed.

FIG. 18 is a truth table describing embodiments where the soft program over program verification is performed after both lower page and upper page programming has been performed. In order to accommodate such a task, it is necessary to consider the lower page data and upper page data. Because both the upper page and lower page programming operations have been performed, the truth table includes columns for all four states: 11, 10, 00, and 01. The second row of the truth table indicates data read from the cell while applying VopSP' to the control gate. If the cell is intended to be in state 11, then the read operation will return a 1 if the cell is not over programmed and a 0 if it is over programmed. If the cell is in any of the other three states, a 0 should be returned because the previous verification step during the programming process would have ensured that the cell's threshold voltage was sufficiently higher than the appropriate verification points. The third row of the truth table indicates the contents of second data latch 404, which stores the results of the previously described read operation. The fourth row indicates the contents of third data latch 402. The third data latch stores the lower page data, as described above. The fifth row indicates the result of the over programming verification for state 11. The state machine checks to determine whether third data latch 406 is storing a logic 1 and second data latch 404 is storing a logic 0. If so, the over programming test fails because the memory cell is over programmed. If not, the test passes.

In another embodiment, rather than use the data previously stored in the third data latch, the system will subsequently perform another read at Vr10. Such a read operation determines whether the threshold voltage of the cell is above VopSP' and below Vr10. If so, the state machine concludes that the memory cell is over programmed; otherwise, the state machine assumes that the memory cell is not over programmed.

FIG. 19 is a truth table describing the process for verifying whether a programming process that programs a cell to state 10 over programmed the cell. The verification process associated with FIG. 19 is performed after a lower page programming process and prior to an upper page programming process. The truth table has two columns, with one column corresponding to the situation when a logic "1" was programmed to the lower page and the other column corresponding to the situation when a logic "0" was programmed to the lower page. The second row indicates data from a read operation that applies Vop10' to the control gate. If the memory cell was intended to remain in state 11 or the memory cell was properly programmed to state 10, then the read operation at Vop10' will result in the memory cell turning on and a logic "1" being reported. This result of the read operation is stored in second data latch 404 (see the third row of the truth table). If the cell was intended to be programmed to state 10 and was over programmed, then the read operation at Vop10' would result in a logic "0" because the cell will not turn on. First data latch 402 stores the data that was programmed (see fourth row). If a logic "1" was programmed (e.g., no programming done), then both second data latch 404 and first data latch 402 would store logic 1 and the test would pass (see fifth row). If a logic "0" was appropriately programmed, then first data latch 404 would store logic 0, second data latch 402 would store logic 1 and the test would pass. If second data latch 404 is at logic 0 and first data latch 402 is at logic 0, then the test fails because the cell is over programmed.

FIG. 20 is a truth table describing the process for performing a state 10 over programming verification after both the lower page and upper page have been programmed. Because both pages have been programmed, there are four columns, one for each state that a cell can be programmed to—11, 10, 00, and 01. The second row indicates data from a read operation that applies Vop10' to the control gate. The result of that read operation is stored in second data latch 404 (third row). If the memory cell remained in state 11 or was properly programmed to state 10, then the memory cell will turn on and a logic "1" will be read. If the cell was intended to be programmed to state 10, but was over programmed, then the cell will not turn on and a logic "0" will be returned. If the cell was programmed to state 00 or state 01 during upper page programming, then the cell will not turn on and a logic "0" will be read. First data latch 402 will store the data from the most recently performed upper page program operation (fourth row). For example, if the cell is in state 11 or 10, then the first data latch will store logic "1." If the cell is in state 00 or 01, the first data latch will store logic "0." The system will then test to determine whether first data latch 402 is storing logic 1 and second data latch 404 is storing logic 0. If so, then the verification process fails because the memory cell was over programmed. Otherwise, the verification process passes (fifth row).

FIG. 21 is a truth table describing the process for performing state 00 over program verification. The process of verifying state 00 is performed after upper page and lower page programming; therefore, the truth table of FIG. 21 shows four columns (one for each state that the cell can be programmed to). First, a read operation is performed that includes applying Vop00' to the control gates (see the second row of the truth table). If the cell was properly programmed into state 11, 10, or 00, then the cell will turn on and a logic "1" will be returned. If the cell was programmed into state 01, then the cell will not turn on and logic "0" will be returned. If the cell was intended to be programmed into state 00 but was over programmed, then the cell will not turn on and logic "0" will be returned. The data returned from the read operation is stored in second data latch 404 (see third row of the truth table). The fourth row indicates the contents of third data latch 402. The third data latch stores the lower page data, as described above. The fifth row indicates the result of the over programming verification for state 00. The state machine checks to determine whether third data latch 406 is storing a logic "0" and the second data latch 404 is storing a logic 0. If so, the over programming test fails because the memory cell is over programmed. If not, the test passes.

In another embodiment, rather than use the data previously stored in the third data latch, the system will subsequently perform another read at Vr01 Such a read operation determines whether the threshold voltage of the cell is above Vop00' and below Vr01. If so, the state machine concludes that the memory cell is over programmed; otherwise, the state machine assumes that the memory cell is not over programmed.

FIG. 22 is a truth table describing a process for performing state 01 over program verification. Because the process is performed after an upper page read, there are four columns, one for each state that the cell can be programmed to. The second row of FIG. 22 indicates the results from a read operation that includes applying Vop01' to the control gate. The data resulting from the read operation is stored in second data latch 404 (third row). The data resulting from the read operation should always be logic 1, regardless of what state the cell is in. Thus, if a logic "0" is returned, the verification step fails; otherwise, the verification step passes (fourth row).

Note that the flow chart of FIG. 9 contemplates that if a lower page programming operation is performed then soft program verification and state 10 over program verification is performed, and if an upper page programming operation is performed then state 00 over program verification is performed and state 01 over program verification performed. This methodology can also be used with the processes discussed above with respect to FIGS. 17, 19, 21, and 22. In one alternative, all of the over program verifications can be performed after both the lower page and upper page have been written using the processes discussed above with respect to truth tables of FIGS. 18, 20, 21, and 22. In another alternative, after a lower page programming process is performed, the verification processes discussed above with respect to FIG. 17 can be performed. When the upper page is programmed, the system will perform the over program verification for states 10, 00, and 01 using the truth tables of FIGS. 20, 21, and 22.

The above examples are provided with respect to NAND type flash memory. However, the principles of the present invention have application to other types of flash memories and other types of non-volatile memories, including those currently existing and those contemplated to use new technology being developed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method for detecting over programming, comprising the steps of:

programming one or more multi-state storage elements associated with a first control line;

programming one or more multi-state storage elements associated with a second control line subsequent to said step of programming said one or more multi-state storage elements associated with said first control line; and determining whether said one or more multi-state storage elements associated with said first control line are over programmed after performing said step of programming said one or more multi-state storage elements associated with said second control line.

2. A method according to claim 1, wherein:

said first control line is a first bit line; and said second control line is a second bit line adjacent to said first bit line.

3. A method according to claim 1, wherein:

said first control line is a first word line; and said second control line is a second word line adjacent to said first word line.

4. A method according to claim 1, further comprising the step of:

fixing data for storage elements determined to be over programmed.

5. A method according to claim 4, wherein:

said step of fixing data include lowering a threshold voltage for a particular storage element to be within the next lowest threshold distribution.

6. A method according to claim 1, wherein:

said step of determining includes detecting whether a particular storage element is over programmed due to existence of an electric field resulting from charge on a storage element adjacent to said particular storage element.

7. A method according to claim 1, wherein:
said step of determining includes detecting whether a particular storage element has a threshold voltage within any one or a set of one or more over program ranges.

8. A method according to claim 1, wherein:
said step of determining includes detecting whether a particular storage element has a threshold voltage within any one or a set of one or more over program ranges, said over program ranges are determined by estimating an effect of an electric field resulting from charge on a storage element adjacent to said particular storage element.

9. A method according to claim 1, wherein said step of determining includes performing a method comprising the steps of:
performing read operations on said multi-state storage element associated with said first control line for edges of one or more over program ranges; and
determining that a particular multi-state storage element associated with said first control line is over programmed if said particular multi-state storage element has threshold voltage within one or said one or more over program ranges, said particular multi-state storage element is adjacent to at least one of said multi-state storage elements associated with said second control line.

10. A method according to claim 9, wherein:
said first control line is a first word line; and
said second control line is a second word line.

11. A method according to claim 1, wherein said step of determining includes performing a method comprising the steps of:
performing read operations on said multi-state storage elements associated with said first control line for a set of one or more read compare points in order to determine initial states for said multi-state storage element associated with said first control line;
performing an error correction code process for said multi-state storage element associated with said first control line and said initial states; and
determining that a particular multi-state storage element associated with said first control line is over programmed if said error correction code process for said particular multi-state storage element fails, said particular multi-state storage element is adjacent to at least one of said multi-state storage elements associated with said second control line.

12. A method according to claim 11, wherein:
said first control line is a first word line; and
said second control line is a second word line.

13. A method according to claim 10, further comprising the step of:
fixing data for said particular multi-state storage if said particular multi-state storage is over programmed.

14. A method according to claim 1, wherein:
said one or more multi-state storage elements associated with said first control line and said one or more multi-state storage elements associated with said second control line are NAND flash memory elements.

15. A method according to claim 1, wherein:
said one or more multi-state storage elements associated with said first control line are part of an array of storage elements;

said array of storage elements is on an integrated circuit chip; and
said step of determining is performed by one or more circuits on said integrated circuit chip.

16. A method for detecting over programming, comprising the steps of:
programming a first multi-state storage element;
programming a second multi-state storage element, said second multi-state storage element has an electric field that can have an effect on said first multi-state storage element, said step of programming a second first multi-state storage element is commenced after performing said step of programming said first multi-state storage element; and
determining whether said first multi-state storage element is over programmed after performing said step of programming said second multi-state storage element.

17. A method according to claim 16, wherein:
said first multi-state storage element is connected to a first word line;
said second multi-state storage element is connected to a second word line; and
said second multi-state storage element is adjacent to said first multi-state storage element.

18. A method according to claim 16, wherein:
said first multi-state storage element is part of a first NAND chain connected to a first bit line; and
said second multi-state storage element is part of a second NAND chain connected to a second word line.

19. A method according to claim 16, wherein:
said step of determining includes detecting whether said first multi-state storage element is over programmed due to existence of an electric field resulting from charge on said second multi-state storage element, said second multi-state storage element is adjacent to said first multi-state storage element.

20. A method according to claim 16, wherein said step of determining includes performing a method comprising the steps of:
performing read operations on said first multi-state storage element for edges of one or more over program ranges; and
determining that said first multi-state storage element is over programmed if said first multi-state storage element has a threshold voltage within one or said one or more over program ranges, said second multi-state storage element is adjacent to said first multi-state storage element.

21. A method according to claim 16, wherein said step of determining includes performing a method comprising the steps of:
performing read operations on said first multi-state storage element for a set of one or more read compare points in order to determine initial states for said first multi-state storage element;
performing an error correction code process for said first multi-state storage element and said initial state; and
determining said first multi-state storage element is over programmed if said error correction code process fails, said second multi-state storage element is adjacent to said first multi-state storage element.

22. A memory system, comprising:
means for programming one or more multi-state storage elements associated with a first control line;

means for programming said one or more multi-state storage elements associated with a second control line subsequent to said step of programming said one or more multi-state storage elements associated with said first control line; and means for determining whether said one or more multi-state storage elements associated with said first control line are over programmed after performing said step of programming said one or more multi-state storage elements associated with said second control line.

23. A memory system according to claim 22, wherein means for determining includes:

means for performing read operations on said one or more multi-state storage elements associated with said first control line for edges of one or more over program ranges; and means for determining that said one or more multi-state storage elements associated with said first control line are over programmed if said one or more multi-state storage elements associated with said first control line have a threshold voltage within one of said over program ranges.

24. A memory system according to claim 23, wherein:

said first control line is a first word line; and said second control line is a second word line.

25. A memory system according to claim 22, wherein said means for determining includes:

means for performing read operations on said one or more multi-state storage elements associated with said first control line for a set of one or more read compare points in order to determine initial states for said first multi-state storage element;

means for performing an error correction code process for said one or more multi-state storage elements associated with said first control line; and means for determining whether said one or more multi-state storage elements associated with said first control line are over programmed if said error correction code process fails.

26. A memory system according to claim 25, wherein:

said first control line is a first word line; and said second control line is a second word line.

27. A memory system, comprising:

an array of multi-state storage elements; and a managing circuit in communication with said array of multi-state storage elements, said managing circuit performs programming operations including programming one or more of said multi-state storage elements that are associated with a first control line and subsequently programming one or more of said multi-state storage elements that are associated with a second control line, said managing circuit determines whether said one or more multi-state storage elements associated with said first control line are over programmed after programming said one or more multi-state storage elements associated with said second control line, at least a subset of said multi-state storage elements associated with said second control line are adjacent to multi-state storage elements associated with said first control line.

28. A memory system according to claim 27, wherein:

said first control line is a first bit line; and said second control line is a second bit line adjacent to said first bit line.

29. A memory system according to claim 27, wherein:

said first control line is a first word line; and said second control line is a second word line adjacent to said first word line.

30. A memory system according to claim 27, wherein:

said one or more multi-state storage elements associated with said first control line and said one or more multi-state storage elements associated with said second control line are NAND flash memory elements.

31. A memory system according to claim 27, wherein:

said one or more multi-state storage elements are part of an array of storage elements;

said array of storage elements is on an integrated circuit chip;

said managing circuit includes a state machine;

said state machine is on said integrated circuit chip; and said state machine performs said determination of whether said one or more multi-state storage elements associated with said first control line are over programmed.

32. A memory system according to claim 27, wherein:

said managing circuit fixes data for storage elements determined to be over programmed.

33. A memory system according to claim 27, wherein:

said managing circuit detects whether a particular storage element is over programmed due to existence of an electric field resulting from charge on a storage element adjacent to said particular storage element.

34. A memory system according to claim 27, wherein:

said managing circuit detects whether a particular storage element has a threshold voltage within any of a set of one or more over program ranges, said over program ranges are determined by estimating an effect of an electric field resulting from charge on a storage element adjacent to said particular storage element.

35. A memory system according to claim 27, wherein:

said managing circuit performs read operations on said multi-state storage elements associated with said first control line for edges of one or more over program ranges and determines that a particular multi-state storage element associated with said first control line is over programmed if said particular multi-state storage element has threshold voltage within one or said one or more over program ranges.

36. A memory system according to claim 35, wherein:

said first control line is a first word line; and said second control line is a second word line adjacent to said first word line.

37. A memory system according to claim 27, wherein:

said managing circuit performs read operations on said multi-state storage elements associated with said first control line for a set of one or more read compare points in order to determine initial states for said multi-state storage element associated with said first control line and performs an error correction code process for said multi-state storage element associated with said first control line, said managing circuit determines that a particular multi-state storage element associated with said first control line is over programmed if said error correction code process for said particular multi-state storage element fails.

38. A memory system according to claim 37, wherein:

said first control line is a first word line; and said second control line is a second word line adjacent to said first word line.

* * * * *